United States Patent [19]
Usami et al.

[11] Patent Number: 5,148,436
[45] Date of Patent: Sep. 15, 1992

[54] CIRCUIT FOR DETECTING FALSE READ DATA FROM EPROM

[75] Inventors: Tadashi Usami, Hino; Masahiro Kosuge, Kawasaki, both of Japan

[73] Assignee: Motorola, Inc., Schaumburg, Ill.

[21] Appl. No.: 597,243

[22] Filed: Oct. 15, 1990

[51] Int. Cl.$^5$ .................................. G06F 11/00
[52] U.S. Cl. .................................. 371/21.1; 365/201
[58] Field of Search .............. 371/21.1; 364/201, 177; 365/201

[56] References Cited

U.S. PATENT DOCUMENTS

| | | | |
|---|---|---|---|
| 4,543,647 | 9/1985 | Yoshida | 365/201 |
| 4,651,304 | 3/1987 | Takata | 365/201 |
| 4,870,618 | 9/1989 | Iwashita | 365/201 |
| 4,905,191 | 2/1990 | Arai | 365/201 |
| 4,937,787 | 6/1990 | Kobatake | 371/21.1 |
| 4,956,816 | 9/1990 | Otsumi et al. | 365/201 |

*Primary Examiner*—Jerry Smith
*Assistant Examiner*—Trinh L. Tu
*Attorney, Agent, or Firm*—James L. Clingan, Jr.

[57] ABSTRACT

First and second EPROM transistors are coupled in series to a power source, a third EPROM transistor is connected in parallel with the series connection and a two input NAND gate has a first input connected to the junction between the first and second EPROM transistors by an inverter and a second input connected to the drain of the third transistor. The first and third transistors are programmed with the EPROM and the second transistor is not. When a read signal is applied to the gates of all three transistors a predetermined signal will be available at the output of the NAND gate if the EPROM read condition is not faulty.

10 Claims, 1 Drawing Sheet

CIRCUIT FOR DETECTING FALSE READ DATA FROM EPROM

The present invention pertains to circuitry for detecting false read data and some security breaches in an EPROM and more specifically to circuitry for detecting changes in EPROM data due to voltage changes in the power supply.

BACKGROUND OF THE INVENTION

In general, erasable programmable read only memories (EPROMs) include arrays of special transistors, such as floating gate field effect transistors, MOS ROMs, etc., (hereinafter referred to as EPROM transistors) that can be programmed for usual memory purposes. Programming an EPROM transistor consists of storing an electrical charge at the gate of the EPROM transistor being programmed so that the EPROM transistor can not be turned on. As is well known in the art, the transistors in a memory array operate like switches with some being turned off and some being turned on to provide the predetermined output data. The programmed EPROM transistors in an EPROM are the "off" switches in this arrangement.

EPROM transistors are designed so that under normal conditions the programming, or the charge stored at the gate, will last for years. However, The programming must take place under prescribed voltage conditions and read lines, etc. must not exceed a prescribed voltage by too much. Sometimes excessive reading of the memory, fluctuating voltages, excessive voltage on the read line, etc. can drain the stored charge at the gates of EPROM transistors in the memory array and cause the data to become erroneous. Conversely, excessive current flow in EPROM transistors can cause them to become falsely programmed. It is essential that false or erroneous data be detected as early as possible.

SUMMARY OF THE INVENTION

It is an object of the present invention to provide a new and improved EPROM including a circuit for detecting false read data.

It is a further object of the present invention to provide a new and improved circuit for detecting false read data in an EPROM.

It is a further object of the present invention to provide a new and improved test circuit for EPROMs which continuously monitors the condition of the EPROM during reading thereof.

It is a further object of the present invention to provide a new and improved test circuit for EPROMs which is included in the EPROM during manufacture and which is inexpensive to construct and operate.

It is a further object of the present invention to provide a circuit for detecting some breaches, or attempted breaches, of security of data stored in an EPROM.

The above described objects and others are realized in a test circuit including at least two EPROM transistors formed on a semiconductor substrate with an EPROM, one of which is programmed with the EPROM, and a logic element connected to the two EPROM transistors for providing an output indicative of a reading failure, or failure in the programmed state, in the programmed transistor in response to a test signal applied to the gates of the two EPROM transistors.

The above described objects and others are further realized in a circuit for detecting false read data in an EPROM, the circuit comprising at least first, second and third EPROM transistors with the first and second EPROM transistors being coupled in series between a voltage supply and a reference point and the third EPROM transistor being coupled in parallel with the series connected first and second EPROM transistors and one or more logic elements being coupled to the drains of the first and third EPROM transistors for determining the operation thereof, by means of a predetermined output signal, in response to a read signal applied to the gates of all three EPROM transistors.

DESCRIPTION OF THE PREFERRED EMBODIMENTS

EPROMs are generally made up of a large number of EPROM transistors positioned in a memory array and some additional transistors utilized as sense amplifiers and the like for reading information stored in the memory. For example, an 8k EPROM has approximately 8192 transistors formed on the single chip. The present invention calls for the addition of two or three EPROM transistors and one or more logic elements to the chip for providing a circuit which detects false read data from the EPROM.

Figure 1:
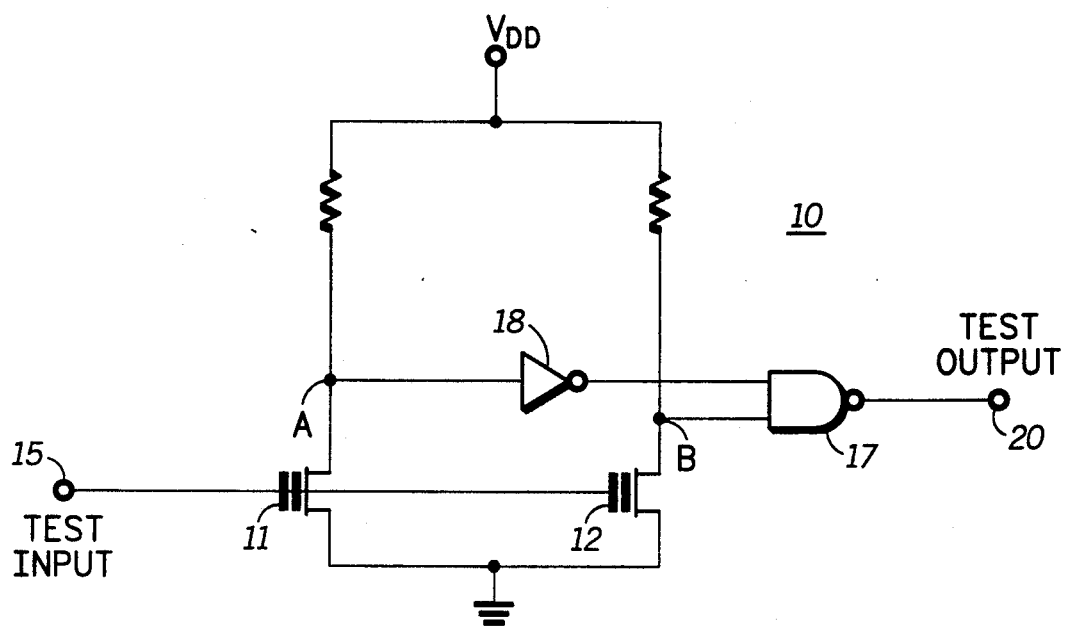
FIG. 1 is a schematic diagram of a false data sensing circuit embodying the present invention.

FIG. 1 illustrates a circuit 10 for detecting false read data from an EPROM, which circuit 10 embodies the present invention. Circuit 10 includes first and second EPROM transistors 11 and 12, respectively. Transistors 11 and 12 each have source electrodes connected to a reference potential, which in this embodiment is ground, and drain electrodes connected to a power supply $V_{dd}$. The gate electrodes of transistors 11 and 12 are connected to a test signal input terminal 15. A two input NAND gate 17 has a first input coupled through an inverter 18 to the drain electrode of first transistor 11 (point A). A second input of NAND gate 17 is connected to the drain electrode of second transistor 12 (point B). As is well known to those skilled in the art, NAND gate 17 and inverter 18 may be considered a single logic element or as many as three (inverter, AND gate, inverter). The output 20 of NAND gate 17 is the test output for circuit 10.

In the operation of circuit 10, transistors 11 and 12 are included on the same chip as the EPROM. It is more practical to include NAND gate 17 and inverter 18 on the same chip also, but it will be recognized that in some instances it may be desirable to locate these components off the chip. When the EPROM is programmed with the desired data, transistor 12 is also programmed to be in the nonconduction state.

Whenever the data in the EPROM is to be used, a one or positive signal is first applied to test input terminal 15. The one on input terminal 15 causes transistor 11 to conduct, which causes the reference potential (ground in this embodiment) to be applied to inverter 18. This is equivalent to a zero at point A. Thus a one or positive signal is supplied to the first input of NAND gate 17. Also, a one or positive signal applied to the gate electrode of transistor 12 results in a positive signal being applied to the second input of NAND gate 17.

Assuming that transistor 12 is properly programmed in the nonconduction state, the one or positive signal applied to the gate electrode of transistor 12 has no effect and the logic level at point B remains a one. Thus the test output on terminal 20 is a zero or low signal. Since transistor 12 was programmed with the EPROM, if the reading of circuit 10 is correct the read data (program) from the entire EPROM is normally correct. If the read data of transistor 12 is incorrect, the positive test signals applied to the gate electrode thereof will cause it to conduct and a one or positive signal will appear at output terminal 20, indicating a failure. The truth table for circuit 10 appears below:

TABLE I

|         | A | B | OUT |
|---------|---|---|-----|
| X       | 0 | 0 | 1   |
| Correct | 0 | 1 | 0   |
| X       | 1 | 0 | 1   |
| X       | 1 | 1 | 1   |

One difficulty with circuit 10 is the fact that a continuous positive signal applied to input terminal 15 and the continuous current through transistor 11 resulting therefrom, will eventually cause transistor 11 to change from a zero (unprogrammed) to a 1 (programmed), which is referred to in the art as soft programming. That is, it will operate the same as transistor 12 and, thus, produce a failure in testing circuit 10, resulting in an apparent failure in the programmed state of the EPROM. Thus, only short test pulses can be applied to circuit 10 for testing the programmed state of (reading) an associated EPROM.

Figure 2:
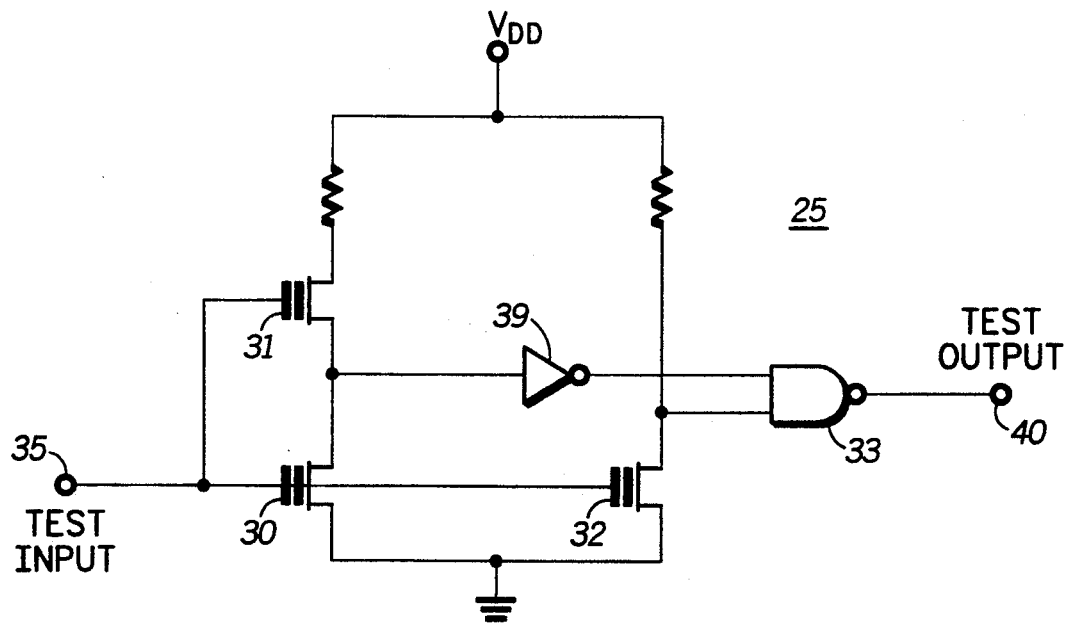
FIG. 2 is a schematic diagram of an improved circuit, including circuitry which prevents soft programming, for detecting false read data from an EPROM embodying the present invention.

Referring specifically to FIG. 2, a second but preferred circuit 25 for detecting false read data from an EPROM, embodying the present invention, is disclosed. In circuit 25, two programmed EPROM transistors 31 and 32 are utilized along with a test device, which in this embodiment is a non-programmed EPROM transistor 30. Transistors 30 and 31 are coupled in series between the power source terminal and ground and transistor 32 is coupled in parallel with transistors 30 and 31. A logic element, including a NAND gate 38 and an inverter 39, is connected to the drains of transistors 30 and 32. The drain of transistor 30 is coupled to a first input of NAND gate 33 through inverter 39 and the drain of transistor 32 is connected to a second input of NAND gate 33. Transistors 31 and 32 are both programmed with the associated EPROM. Transistor 30 is illustrated as an EPROM transistor but it is unprogrammed and could be a different type of transistor, if such an arrangement is more convenient. It should be noted, however, that making transistor 30 an EPROM transistor provides the capability of preventing and detecting 0 to 1 changes.

In operation, a positive test signal is supplied to a test input terminal 35, which is connected to the gates of transistors 30 through 32. The positive test signal has no effect on programmed transistors 31 and 32 but unprogrammed transistor 30 is turned on. Thus, a low or zero logic signal is supplied to inverter 39 which supplies a positive or logic one signal to the first input of NAND gate 33. At the same time transistor 32 remains off so that a positive or logic one signal is supplied to the second input of NAND gate 33. Thus, the logic circuit monitors transistors 30 through 32 and supplies a predetermined output signal at output terminal 40 if transistors 31 and 32 are properly programmed.

The major advantage of circuit 25 is the fact that a continuous test signal can be applied to the test input terminal and the unprogrammed state of EPROM transistors 30 will not be effected. By placing a second programmed transistor (EPROM transistor 31) in the circuit, current flow in circuit 25 is virtually reduced to zero. Thus, circuit 25 is included on a semiconductor chip with an EPROM and a continuous test signal, for example $V_{dd}$, is applied to the test input terminal. The test output is monitored by some selected instrument so that an alarm signal is produced whenever the output changes from zero to one. Since virtually no current flows in circuit 25 it will consume virtually no power.

It should be noted that circuits 10 and 25 can also be used as security checking circuits. If a third party attempts to read the EPROM without knowing the exact pin usage, or without knowing that circuit 10 is a test circuit, or without having the correct read voltage, the programming of the EPROM transistors could be temporarily over-ridden to cause an apparent failure of the test circuit. Because of the apparent failure, the output of the test circuit becomes a one, or high. Since circuit 25 is connected to voltage supply $V_{dd}$ of the EPROM, for example, if too high a voltage supply is connected to the EPROM programmed transistors 31 and 32 will become conductive (turn on in spite of the programming) and indicate a security breach. Since the change of state of the test circuit output indicates a failure of the EPROM programming, or in the above case a breach of security, read data from the EPROM is inhibited or otherwise not provided Thus, a breach of security is prevented. Many other security applications will be found for the circuits embodying the present invention.

It will of course be understood by those skilled in the art that additional and/or different logic elements can be utilized to get additional and/or different predetermined output signals from the detecting circuit. Also, the present embodiments utilize all EPROM transistors for the error detecting circuit but it will be understood by those skilled in the art that at least the non-programmed transistors could be a different type of transistor if the different type is easier to manufacture or otherwise incorporate.

Thus, a circuit for detecting false read data from an EPROM is disclosed, which circuit is simple and inexpensive to incorporate into the EPROM during manufacture. Further, the detecting circuit makes a test of data stored in the EPROM simple and quick with virtually no lost time in setting up the test, since the EPROM transistors included in the detecting circuit are programmed at the same time as the EPROM is programmed. Also, an embodiment of the present invention can be used to continuously test EPROM programming without interrupting the EPROM operation or utilizing any substantial amount of power. As an additional feature, the detecting circuit can be used to detect security breaches under certain conditions.

While we have shown and described specific embodiments of the present invention, further modifications and improvements will occur to those skilled in the art. We desire it to be understood, therefore, that this invention is not limited to the particular forms shown and we intend in the appended claims to cover all modifications which do not depart from the spirit and scope of this invention.

What we claim is:

1. A circuit for detecting false read data in an EPROM comprising first and second EPROM transistors each having a drain adapted to be coupled to a first terminal of a power supply and a source adapted to be coupled to a second terminal of the power supply; and one or more logic elements coupled to the drains of said first and second EPROM transistors for determining the operation thereof, by means of a predetermined output signal, in response to a test signal being applied to gates of said first and second transistors.

2. A circuit for detecting false read data in an EPROM as claimed in claim 1 wherein one of said first and second EPROM transistors is programmed.

3. A circuit for detecting false read data in an EPROM comprising at least first, second and third transistors with the first and second transistors being coupled in series between a voltage supply and a reference point and the third transistor being coupled in parallel with the series connected first and second transistors and one or more logic elements being coupled to the drains of the first and third transistors for determining the operation thereof, by means of a predetermined output signal, in response to a read signal applied to the gates of all three transistors.

4. A circuit as claimed in claim 3 wherein at least two of the three transistors are EPROM transistors located in the EPROM in which false data is to be detected and programmed therewith.

5. In an EPROM including at least first and second semiconductor EPROM devices each having gate, drain and source electrodes with each EPROM device being programmed in the cutoff condition of conduction, a circuit for detecting the actual condition of conduction in each EPROM device comprising:

a semiconductor test device having gate, drain and source electrodes;

means for coupling the drain electrodes of said first and second EPROM devices to a first potential source and for coupling the source electrodes of the second EPROM device and the test device to a second potential source;

a logic element having first and second input terminals and an output terminal;

the gate electrodes of said first and second EPROM devices and said test device being adapted to receive a test input signal;

the source electrode of said first EPROM device and the drain electrode of said test device being connected together and coupled to the first input terminal of said logic element; and the drain electrode of said second EPROM device being coupled to said second input terminal of said logic element, said logic element providing a first predetermined output signal at the output terminal thereof in response to a test signal being supplied to the gate electrodes of the first and second EPROM device and the test device if the EPROM is operating correctly and a second predetermined output signal if the EPROM is not operating correctly.

6. A circuit as claimed in claim 5 wherein the first potential source is a positive source and the second potential source is a reference source.

7. A circuit as claimed in claim 5 wherein the logic element is a NAND gate.

8. A circuit as claimed in claim 7 wherein the source of the first EPROM device and the drain of the test device are coupled to the first input of the NAND gate by an inverter.

9. A circuit as claimed in claim 5 wherein the test device is a field effect transistor.

10. A circuit as claimed in claim 9 wherein the first and second EPROM devices and the test device are all similar semiconductor devices of the EPROM.

* * * * *